(12) United States Patent  
Okita et al.

(10) Patent No.: US 7,557,847 B2  
(45) Date of Patent: Jul. 7, 2009

(54) IMAGE PICKUP APPARATUS AND SYSTEM WITH LOW PARASITIC CAPACITANCE BETWEEN FLOATING DIFFUSION AREA OF A PIXEL AND OUTPUT LINE OF AN ADJACENT PIXEL

(75) Inventors: Akira Okita, Kanagawa-ken (JP); Hiroki Hiyama, Kanagawa-ken (JP); Hideaki Takada, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 891 days.

(21) Appl. No.: 11/047,575

(22) Filed: Feb. 2, 2005

(65) Prior Publication Data

US 2005/0179796 A1    Aug. 18, 2005

(30) Foreign Application Priority Data

Feb. 13, 2004    (JP)    ............................. 2004-036858

(51) Int. Cl.  
*H04N 5/335*    (2006.01)
(52) U.S. Cl. ..................... 348/308; 348/294; 438/149; 257/292; 257/506
(58) Field of Classification Search ................ 348/308, 348/294; 257/292, 506; 438/149  
See application file for complete search history.

(56) References Cited

U.S. PATENT DOCUMENTS

| 5,610,403 | A | * | 3/1997 | Kingsley et al. | ....... 250/370.09 |
| 6,188,094 | B1 | | 2/2001 | Kochi et al. | .................. 257/232 |
| 6,605,850 | B1 | | 8/2003 | Kochi et al. | .................. 257/431 |
| 6,670,990 | B1 | | 12/2003 | Kochi et al. | ................. 348/310 |
| 6,946,637 | B2 | | 9/2005 | Kochi et al. | ............... 250/208.1 |
| 6,960,751 | B2 | | 11/2005 | Hiyama et al. | ........... 250/208.1 |
| 2003/0160295 | A1 | * | 8/2003 | Okita | ......................... 257/506 |
| 2003/0164887 | A1 | | 9/2003 | Koizumi et al. | ............. 348/308 |
| 2005/0098805 | A1 | | 5/2005 | Okita et al. | .................. 257/292 |
| 2005/0122418 | A1 | | 6/2005 | Okita et al. | .................. 348/340 |
| 2005/0168618 | A1 | | 8/2005 | Okita et al. | .................. 348/335 |
| 2005/0174552 | A1 | | 8/2005 | Takada et al. | .................. 355/53 |
| 2005/0268960 | A1 | | 12/2005 | Hiyama et al. | .............. 136/244 |
| 2006/0043261 | A1 | | 3/2006 | Matsuda et al. | .......... 250/208.1 |
| 2006/0043393 | A1 | | 3/2006 | Okita et al. | .................... 257/93 |
| 2006/0043440 | A1 | | 3/2006 | Hiyama et al. | .............. 257/291 |
| 2006/0044434 | A1 | | 3/2006 | Okita et al. | .................. 348/243 |
| 2006/0044439 | A1 | | 3/2006 | Hiyama et al. | .............. 348/294 |

FOREIGN PATENT DOCUMENTS

JP    10-150182    6/1998  
JP    2000-260971    9/2000

* cited by examiner

*Primary Examiner*—Jason Chan  
*Assistant Examiner*—Usman Khan  
(74) *Attorney, Agent, or Firm*—Fitzpatrick, Cella, Harper & Scinto

(57) ABSTRACT

The invention is to reduce a color mixing resulting from influences of adjacent pixels. The invention provides a solid-state image pickup apparatus including plural pixels each including a PN junction area constituting a photoelectric conversion area, a floating diffusion area for holding a charge outputted from the PN junction area, an amplifying transistor for amplifying the charge in the floating diffusion area, and a wiring for connecting at least the floating diffusion area, a gate electrode of the amplifying transistor and a resetting MOS transistor, and a signal output line for outputting signals from the amplifying transistors, the apparatus including shield lines between the wiring of one pixel or the floating diffusion area and the wiring of one pixel and the signal output line of another adjacent pixel.

2 Claims, 11 Drawing Sheets

POLYSILICON LAYER

1st ALUMINUM LAYER

CONTACT HOLE

- ░░░ POLYSILICON LAYER
- ▨▨▨ 1st ALUMINUM LAYER
- ▧▧▧ 2nd ALUMINUM LAYER
- ⊠ CONTACT HOLE
- ■ THROUGH HOLE

IMAGE PICKUP APPARATUS AND SYSTEM WITH LOW PARASITIC CAPACITANCE BETWEEN FLOATING DIFFUSION AREA OF A PIXEL AND OUTPUT LINE OF AN ADJACENT PIXEL

BACKGROUND OF THE INVENTION

1. Field of the Invention

The present invention relates to a solid-state image pickup apparatus and an image pickup system, and more particularly to a solid-state image pickup apparatus including plural pixels each provided with a photoelectric conversion area, a floating diffusion area for holding a charge outputted from the photoelectric conversion area, an amplifier for amplifying the charge in the floating diffusion area, and a wiring connecting the floating diffusion area and an input portion of the amplifier, and a signal output line for outputting signals from the amplifiers.

2. Related Background Art

As one of the types of the solid-state image pickup apparatus, there is known a solid-state image pickup apparatus in which a signal from a photodiode is transferred to a floating diffusion (FD) area, and such signal is amplified by an amplifying transistor of which a gate electrode is connected to the FD area, for signal output to a signal output line.

Such solid-state image pickup apparatus is described for example in Japanese Patent Application Laid-open No. 2000-260971. As shown in FIG. 10, a charge accumulated in a PN junction area (photoelectric conversion area) 13 of a photodiode is transferred through a transfer transistor 14 to an FD area 15, and the signal amplified by an amplifying transistor 16 of which a gate electrode is connected to the FD area 15 is outputted through the amplifying transistor 16 and a selecting transistor 17 to a signal output line 18. The FD area 15 is positioned close to a signal output line 18' of an adjacent pixel.

Also Japanese Patent Application Laid-open No. H10-150182 describes a similar solid-state image pickup apparatus. As shown in FIG. 11, a charge accumulated in a PN junction area of a photodiode is transferred through a transfer transistor to an FD area 15, and the FD area is positioned close to a signal output line of an adjacent pixel.

In case the FD area of a pixel is positioned close to a signal output line of an adjacent pixel, as in the aforementioned solid-state image pickup apparatuses, a parasite capacitance may be generated between the FD area and the signal output line, thereby resulting a color mixing between the adjacent pixels.

In case a pixel is a red (R) pixel while an adjacent pixel is a green (G) pixel, when a signal is read out into the FD area of the R pixel and a signal in the adjacent G pixel is read from the signal output signal, such signals mutually influence by the parasite capacitance between the FD area and the signal output line. Therefore a color mixing is generated when a signal level of the R pixel and a signal level of the G pixel are mutually different.

SUMMARY OF THE INVENTION

In consideration of the foregoing, a solid-state image pickup apparatus of the present invention is a solid-state image pickup apparatus including plural pixels each provided with a photoelectric conversion area, a floating diffusion area for holding a charge outputted from the photoelectric conversion area, an amplifier for amplifying the charge in the floating diffusion area, and a wiring, wherein at least an end of the wiring is connected with the floating diffusion area; and a signal output line for outputting signals from the amplifiers, characterized in that a shield line is provided between the wiring of one pixel or the floating diffusion area and the wiring of one pixel and the signal output line of another pixel adjacent to the such one pixel.

The expression that "a shield line is provided between the wiring of one pixel or the floating diffusion area and the wiring of one pixel and the signal output line of another pixel adjacent to such one pixel" includes not only a case, as shown in a cross-sectional view in FIG. 3, of providing a shield line so as to separate a wiring of one pixel and a signal output line of another pixel adjacent to the one pixel, but also a case, as shown in FIG. 2, of providing at least a part of a shield line within a rectangular area containing a signal output line and a wiring (or a signal output line, a wiring and a contact hole), more specifically a rectangular area (area $X_1$ defined by single-dot chain lines in the drawing) defined by a left end face of an FD wiring 4 on an FD area 2, a right end face of a signal output line $7_2$, an upper end face of the signal output line and lower end face of a contact hole. In order to further reduce the parasite capacitance in the configuration shown in FIG. 2, it is preferable to provide at least a part of the shield line within a rectangular area between the signal output line and the wiring, more specifically a rectangular area (area $X_2$ defined by two-dot chain lines in the drawing) defined by a right end face of the FD wiring 4, a left end face of the signal output line $7_2$, a lower end face of the FD wiring 4 and an upper end face of the signal output line $7_2$.

Also a solid-state image pickup apparatus of the present invention is a solid-state image pickup apparatus including plural pixels each provided with a photoelectric conversion area, a floating diffusion area for holding a charge outputted from the photoelectric conversion area, an amplifier for amplifying the charge in the floating diffusion area, and a wiring of which at least an end is connected with the floating diffusion area, and a signal output line for outputting signals from the amplifiers, characterized in that the signal output line is formed around the floating diffusion area so as to detour the floating diffusion area.

Also a solid-state image pickup apparatus of the present invention is a solid-state image pickup apparatus including plural pixels each provided with a photoelectric conversion area, a floating diffusion area for holding a charge outputted from the photoelectric conversion area, an amplifier for amplifying the charge in the floating diffusion area, and a wiring of which at least an end is connected with the floating diffusion area, and a signal output line for outputting signals from the amplifiers, characterized in that at least a part of the wiring is formed with a larger width than in other wirings including the signal output line.

Also a solid-state image pickup apparatus of the present invention is a solid-state image pickup apparatus including plural pixels each provided with a photoelectric conversion area, a floating diffusion area for holding a charge outputted from the photoelectric conversion area, an amplifier for amplifying the charge in the floating diffusion area, and a wiring of which at least an end is connected with the floating diffusion area, and a signal output line for outputting signals from the amplifiers, characterized in that Cp/Cfd is 1.4% or less wherein Cfd is a capacitance of the floating diffusion area and the wiring, and Cp is a capacitance between the floating diffusion area and the wiring of the one pixel and the signal output line of another pixel adjacent to the one pixel.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

In the following, embodiments of the present invention will be explained with reference to the accompanying drawings.

Embodiment 1

Figure 1:
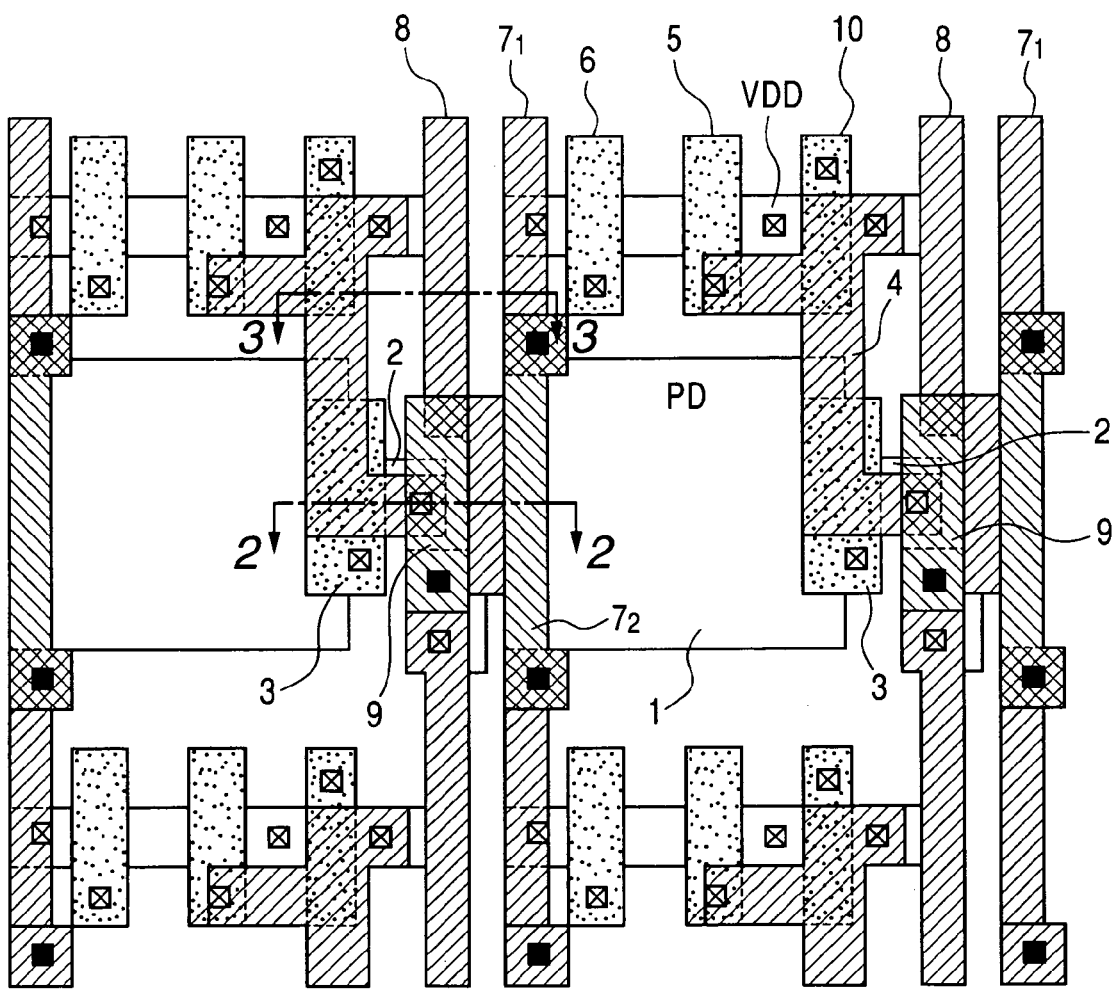
FIG. 1 is a plan view showing a layout of a solid-state image pickup apparatus constituting a first embodiment of the present invention.
Figure 2:
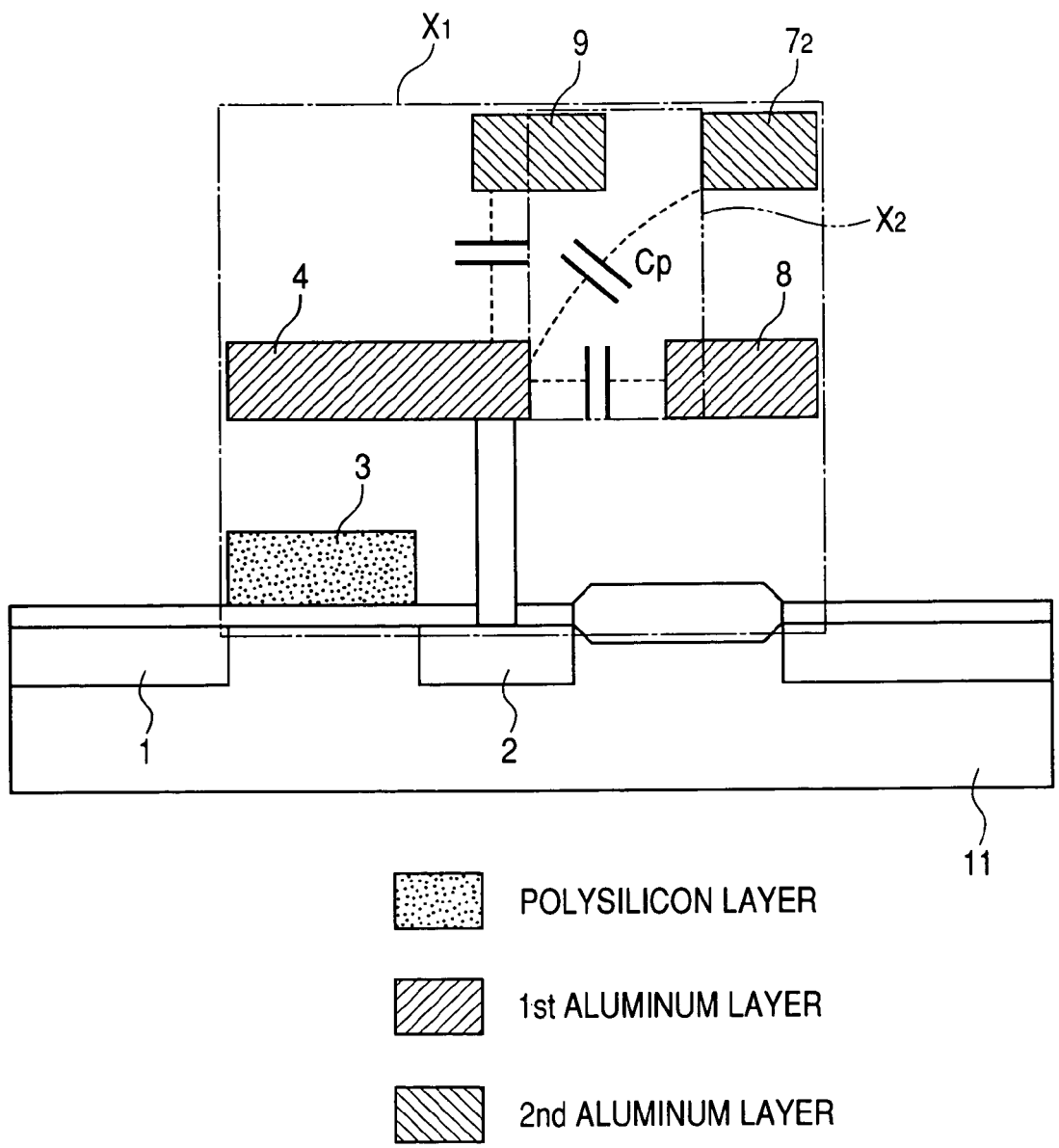
FIG. 2 is a cross-sectional view along a line 2-2 in FIG. 1.
Figure 3:
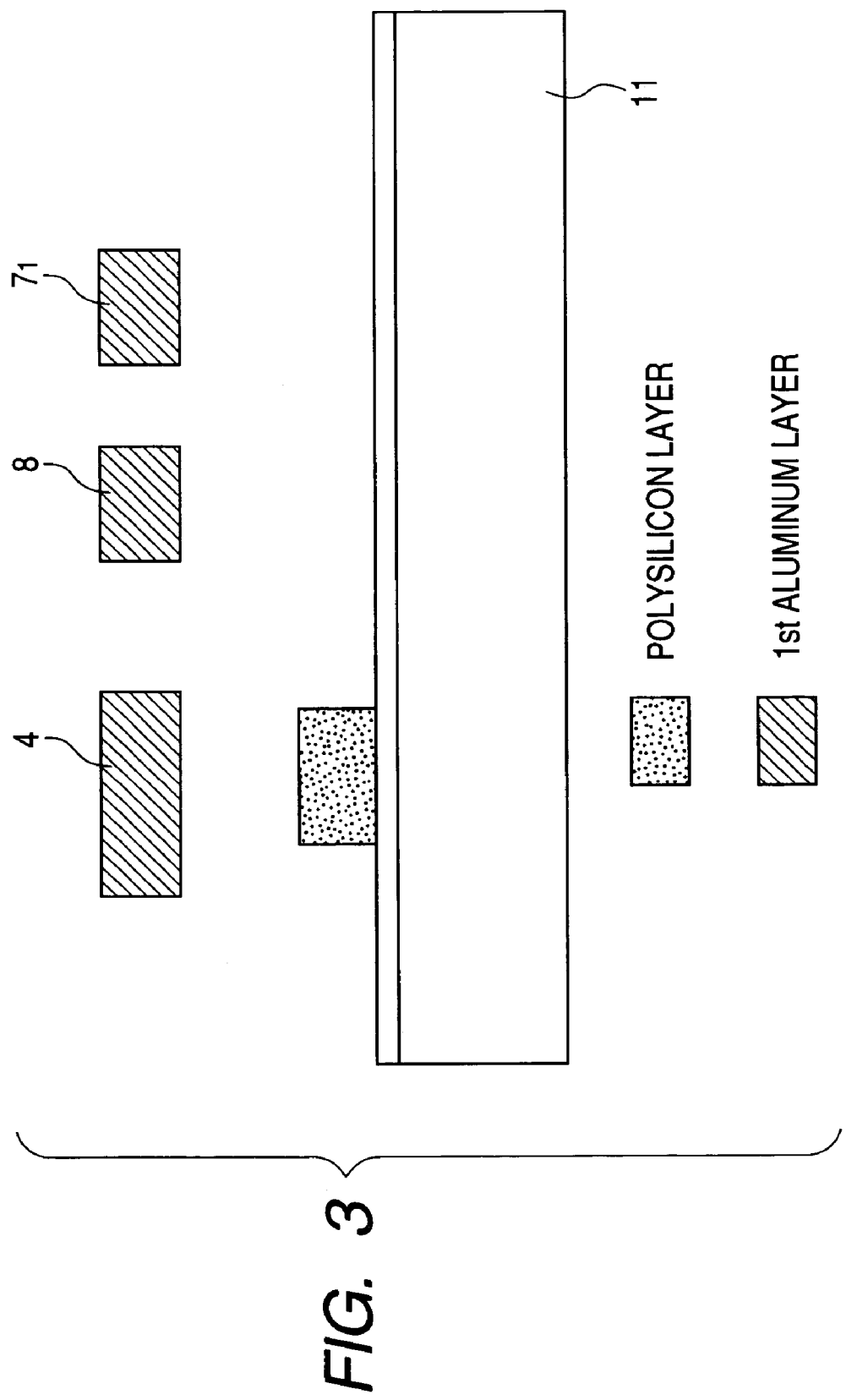
FIG. 3 is a cross-sectional view along a line 3-3 in FIG. 1.

FIG. 1 is a plan view showing a layout of a solid-state image pickup apparatus constituting a first embodiment of the present invention, FIG. 2 is a cross-sectional view along a line 2-2 in FIG. 1, and FIG. 3 is a cross-sectional view along a line 3-3 in FIG. 1.

Referring to FIGS. 1 to 3, there are shown a PN junction area (photoelectric conversion area) 1 of a photodiode constituting a photoelectric conversion element; an FD area 2 for holding a charge accumulated in the PN junction area; a transfer MOS transistor 3 for transferring the accumulated charge from the PN junction area 1 to the FD area 2; an FD wiring 4 for connecting the FD area 2, a gate electrode of amplifying transistor 5 constituting an amplifier (namely an input portion of the amplifier), and a resetting MOS transistor 10; a selecting transistor 6 for selecting a signal from the amplifying transistor 5 for output to a signal output line $7_1$; a first GND line 8; a second GND line 9; and a resetting transistor 10. The second GND line 9 is connected through a through-hole to the first GND line. The signal output line $7_2$ is connected through a through-hole to the signal output line $7_1$. The first GND line 8 and the second GND line 9 constitute a shield line. Also a power source VDD is commonly connected to drains of the amplifying transistor 5, and the resetting MOS transistor 10, and, through not illustrated for the purpose of simplicity, is connected through a first wiring layer and a second wiring layer to an unillustrated third wiring layer.

As illustrated in FIG. 3 which is a cross-sectional view along a line 3-3 in FIG. 1, the first GND line 8 is provided between the signal output line $7_1$ and the FD wiring 4 positioned parallel to the signal output line $7_1$, and the signal output line $7_1$, the FD line 4 and the first GND line 8 are formed by a first wiring layer which is constituted of aluminum. By positioning the GND line functioning also as a shield line between the signal output line and the FD line, it is possible to reduce a parasite capacitance therebetween. In the present embodiment, the GND line for fixing a potential of a substrate (a terminal of a photodiode) at the ground level is utilized as the shield line, but a separate wiring may be provided for this purpose. However, the utilization of the. GND wiring is advantageous as not separate wiring is required.

As the FD area 2 is connected through a through-hole with the FD wiring 4 formed by the first wiring layer, the GND wiring cannot be formed on the FD area 2. Therefore, in order to form the signal output line, the FD line and the GND line by the first wiring layer, a distance for passing the GND line has to be formed between the FD line and the signal output line on the FD area 2. Such embodiment is also possible in the present invention, but a formation of the GND line outside the FD area 2 correspondingly increases the gap between the PN junction areas thereby eventually decreasing the area of the PN junction area.

In the present embodiment, therefore, as shown in FIG. 2 which is a cross-sectional view along a line 2-2 in FIG. 1, the GND wiring 8 in the first wiring layer is formed around the FD area 2 so as to detour the FD area 2 in a square-U shape, and a signal output line is formed in the second wiring layer around the FD area, thereby constituting a signal output line $7_2$ above the GND wiring 8. Also a second GND line 9 in the second wiring layer is formed adjacent to the signal output line $7_2$, and is connected through a through-hole with the first GND line 8. Thus, as shown in FIG. 2, two GND lines 8, 9 are formed in the fist and second wiring layers between the FD wiring 4 and the signal output line $7_2$. The GND line 8 shields the electric force lines between the FD wiring 4 and the signal output line $7_2$, and also shields the electric force lines between the FD area 2 and the signal output line $7_2$. The GND wiring 9 is so formed as to overlap with an end portion of the FD wiring 4, but it is naturally possible also to extend the GND wiring 9 to the left thereby covering the FD line 4. In the present embodiment, the GND lines 8, 9 are so formed that parts thereof are included within a rectangular area (area surrounded by two-dot chain lines) defined by the FD wiring 4, an inner end face of the signal output line $7_2$, a lower end face of the FD wiring 4 and an upper end face of the signal output line $7_2$, but an effect of decreasing the parasite capacitance can be obtained if the GND lines 8, 9 are so formed that parts thereof are included in a rectangular area (area surrounded by one-dot chain line) defined by a contact hole on the FD area 2, the FD wiring 4, an outer end face of the signal output line $7_2$, an upper end face of the signal output line and a lower end face of the contact hole.

Positioning of the GND wiring between the FD wiring and the signal output line, as shown in FIGS. 2 and 3, allows to reduce a capacitative coupling between the FD wiring (or FD area and FD wiring) and the signal output line of the adjacent pixel, thereby reducing the color mixing. An effect of reducing the parasite capacitance can also be obtained by forming a shield line as shown in FIG. 2 only around the FD area or forming a shield line as shown in FIG. 3 excluding the periphery of the FD area, but it is naturally more preferable to form the shield lines both in the periphery of the FD area and in the area other than such periphery thereby achieving a further decrease in the parasite capacitance. Also the configuration of the shield line as shown in FIG. 2 may be adopted in an area other than the periphery of the FD area. Also either one only of the GND wiring 8 and the GND wiring 9 allows to provide an effect of reducing the parasite capacitance.

Also the shield wiring need not necessarily be at the ground level, as long as it has a fixed potential. Further, the shield wiring need not necessarily be always maintained at a fixed potential but may be fixed at a certain potential at least during a signal readout. For example the shield line may be constituted for example of a driving line for a transfer MOS transistor or the like. However, the shield line is preferably maintained at a stable potential such as a power supply potential or a ground potential.

Figure 4:
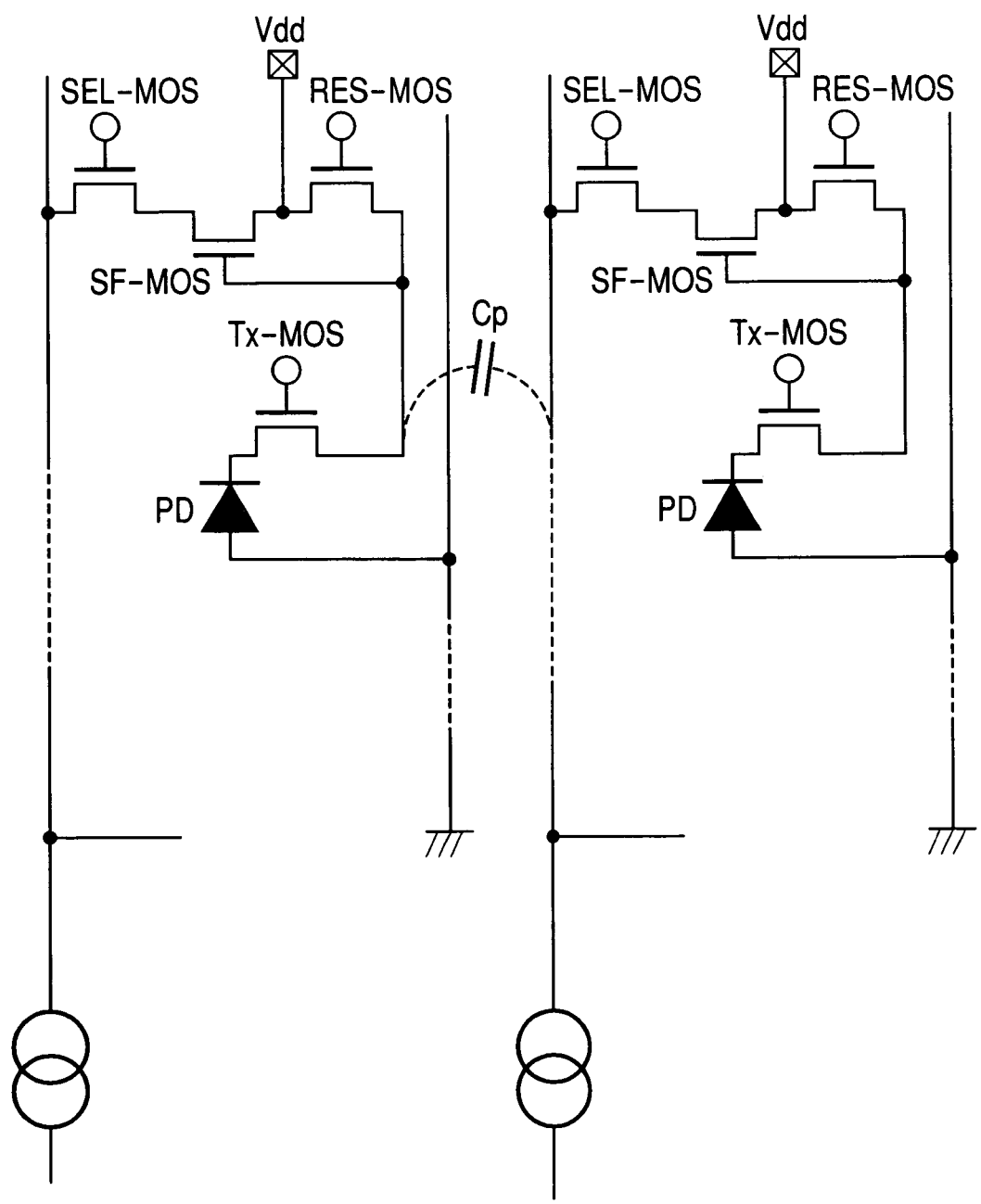
FIG. 4 is an equivalent circuit diagram of a solid-state image pickup apparatus shown in FIG. 1.

FIG. 4 is an equivalent circuit diagram of the solid-state image pickup apparatus shown in FIG. 1. A shield line is provided between the FD area and the FD wiring of one pixel and the signal output line of a pixel of a different color adjacent to the one pixel, in order to decrease the parasite capacitance.

The present inventors find, in addition to a configuration for reducing the color mixing, that a ratio Cp/Cfd, in which Cp represents a parasite capacitance between the FD portion (FD area and FD wiring including the contact hole portion) and the signal output line of the adjacent pixel and Cfd represents a capacitance of the FD portion excluding the parasite capacitance Cp, is preferably 1.4% or less for obtaining an acceptable level for the image quality deterioration by the color mixing, more preferably a ratio Cp/Cfd of 0.8% or less and further preferably 0.4% or less.

Figure 5:
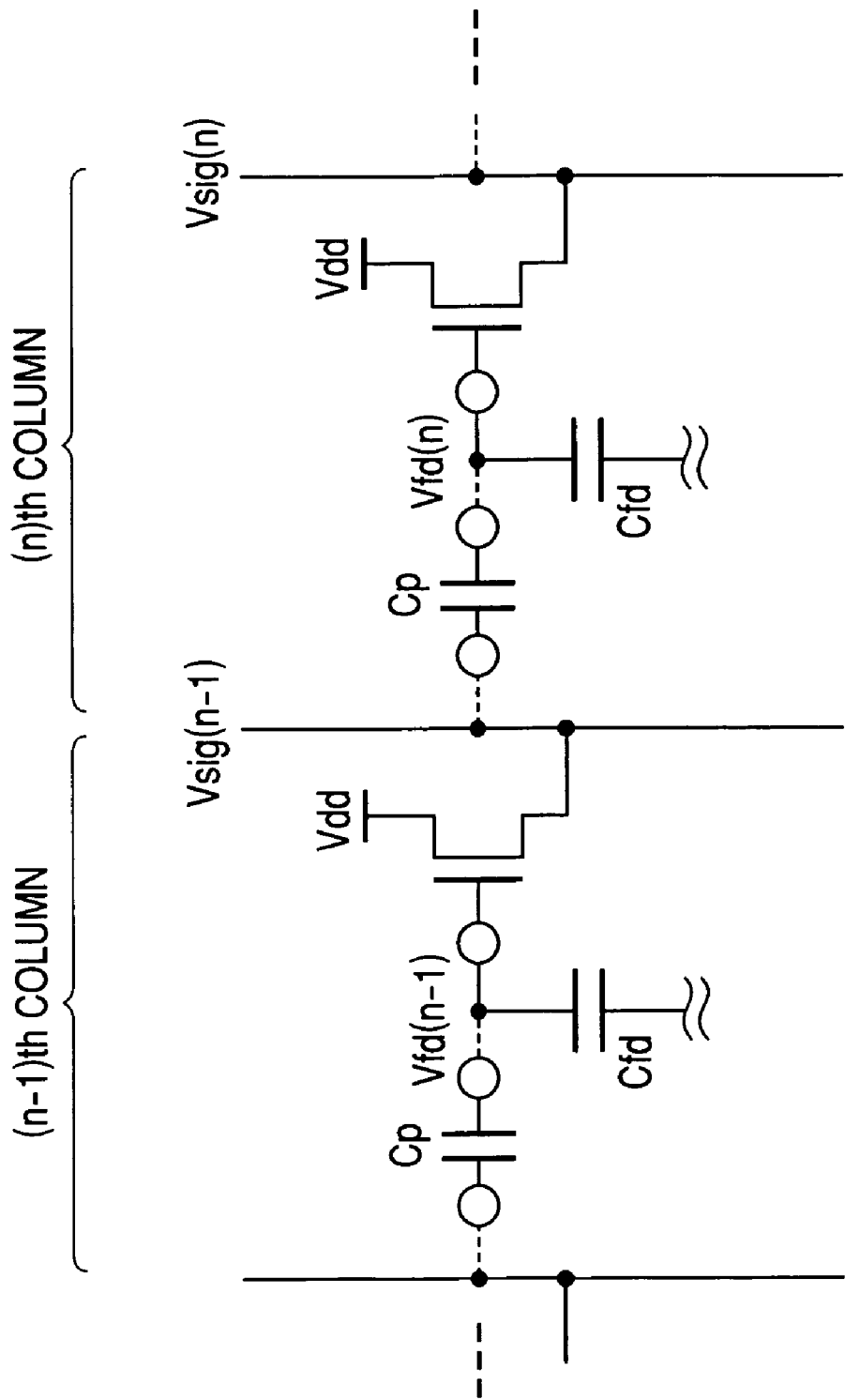
FIG. 5 is an equivalent circuit diagram for explaining the present invention.

FIG. 5 shows an equivalent circuit in which Cp indicates a parasite capacitance between the FD portion (FD area and FD wiring including contact hole portion) and the signal output line of the adjacent pixel, Cfd indicates a capacitance of the FD portion excluding the parasite capacitance Cp, Vfd(n) indicates an FD potential of an n-th column, Vsig(n) indicates a potential of a signal output line of an n-th column, and Vsig(n−1) indicates a potential of a signal output line of an (n−1)th column.

In case of:

$$Vfd(n) = Cp(Cfd+Cp) \times Vsig(n-1) \text{ and}$$

$$Cfd \gg Cp,$$

Vfd(n) can be considered equal to Cp/Cfd×Vsig(n−1).

Thus the FD potential of the n-th column induces a crosstalk of about Cp/Cfd on the potential Vsig(n−1) of the signal output line of (n−1)th column.

Figure 6:
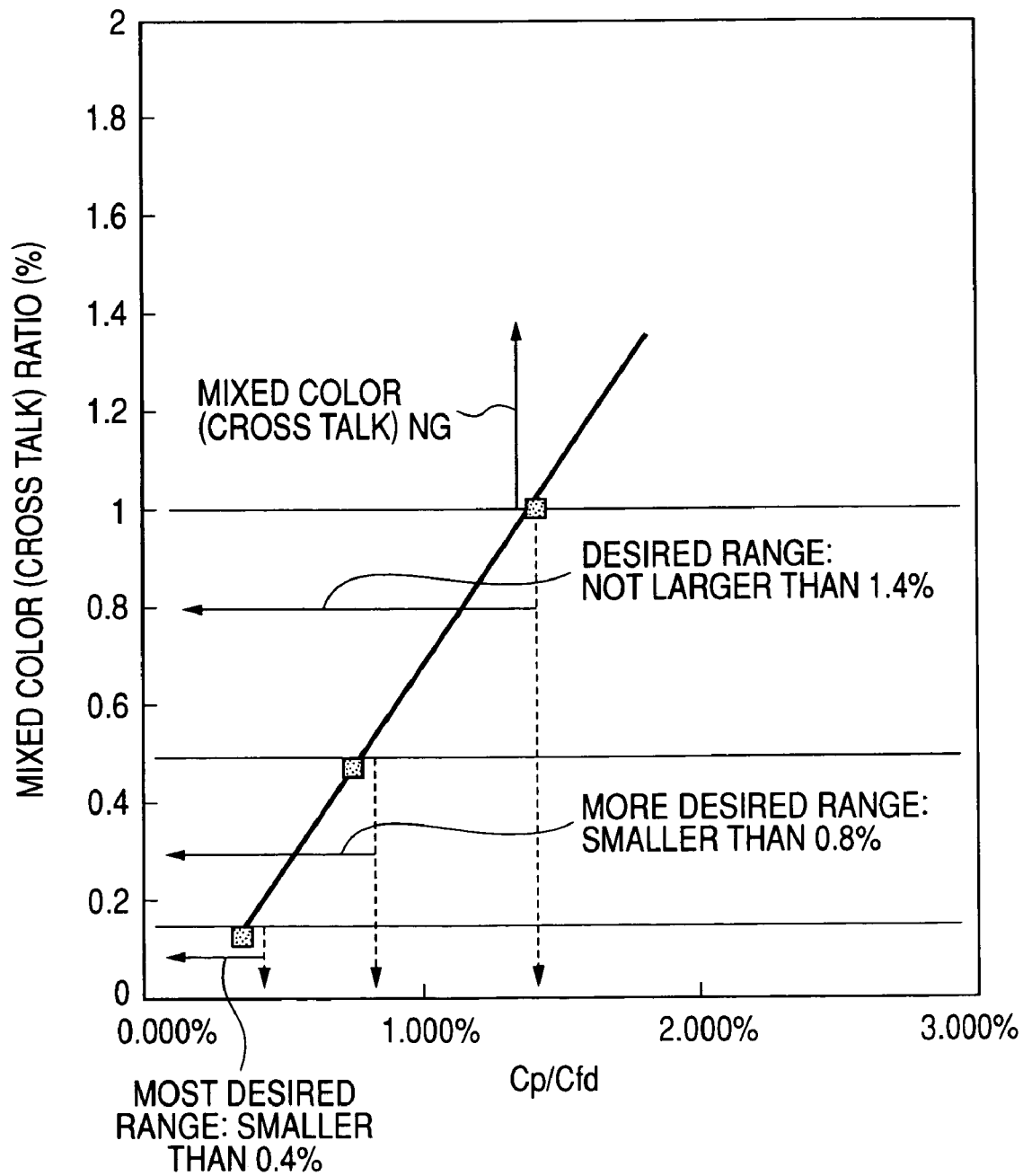
FIG. 6 is a chart showing a dependence of a color mixing rate on a parasite capacitance ratio.

In case the color mixing is evaluated by a mixed color ratio, a mixed color ratio exceeding 1% results in a significant deterioration of image quality as shown in FIG. 6. In order to suppress such image quality deterioration, there is required a ratio of Cp to Cfd of 1.4% or less, preferably 0.8% or less and more preferably 0.4% or less.

The mixed color ratio means a proportion represented by ((pixel output)−(optical pixel output))/(output of adjacent pixel), in which the pixel output means an output read out to the signal output line, and the optical pixel output means a photoelectrically converted output by the photoelectric converting element (photodiode) of the pixel.

When the mixed color ratio is less than 1% (Cp/Cfd of 1.4% or less), a color mixing is not observable in an ordinary image. Also the mixed color ratio less than 0.5% (Cp/Cfd of 0.8% or less) corresponds, in 8-bit data for example of ordinary JPEG data, to a level close to 1LSB in 256 gradation levels (1/256=0.4%), whereby the color mixing becomes almost absent. Also the mixed color ratio close to 0.1% (Cp/Cfd of 0.4% or less) corresponds, in 10-bit data to a level close to 1LSB in 1024 gradation levels (1/1024=0.1%), whereby the color mixing becomes almost absent.

The capacitances Cfd and Cp can be calculated from a layout by a two- or three-dimensional simulator. For example, ATLAS of Silvaco Inc. is available as the two-dimensional simulator, and SPECTRA of Link Research Corporation is available as the three-dimensional simulator.

Embodiment 2

Figure 7:
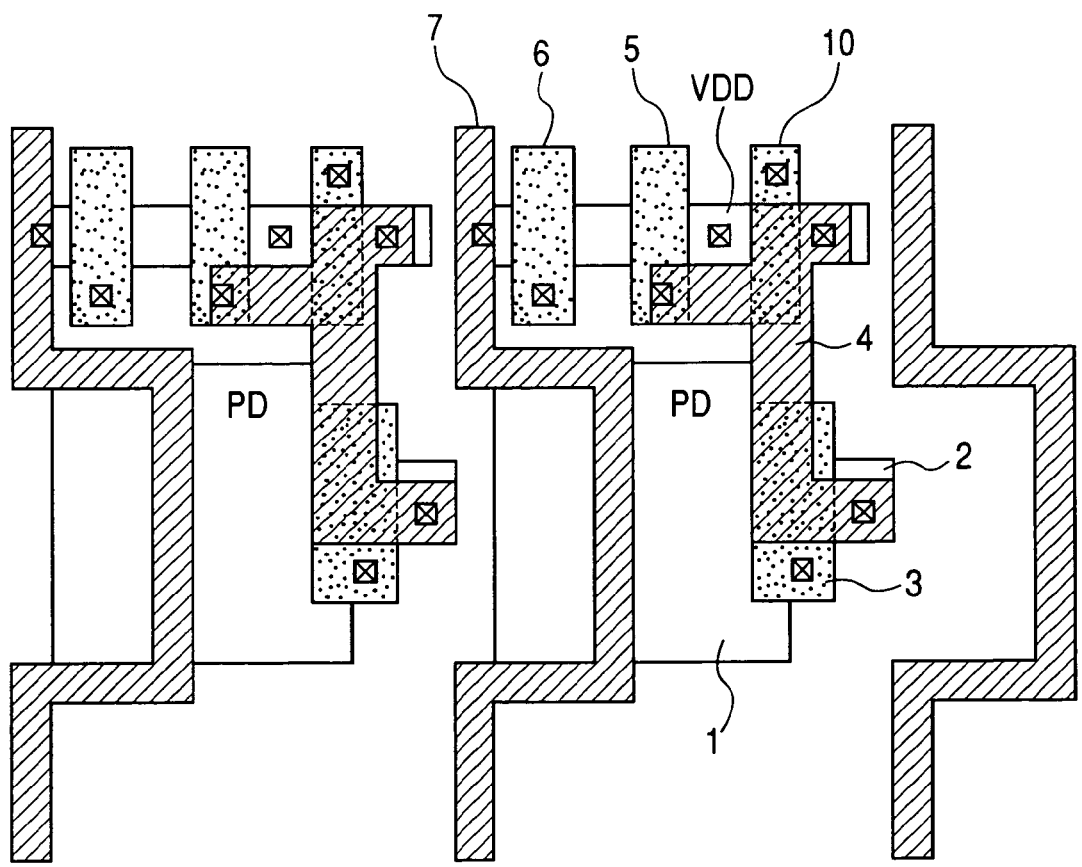
FIG. 7 is a plan view showing a layout of a solid-state image pickup apparatus constituting a second embodiment of the present invention.

FIG. 7 is a plan view showing a layout of a solid-state image pickup apparatus of a second embodiment of the present invention. Components same as those in FIG. 1 are represented as same symbols and will not be explained further. In the present embodiment, a GND wiring serving as a shield wiring is not provided, but a signal output line 7 is formed in a square-U shape around an FD area and on a PN junction area thereby detouring the FD area and decreasing the parasite capacitance between the FD portion and the signal output line.

Embodiment 3

Figure 8:
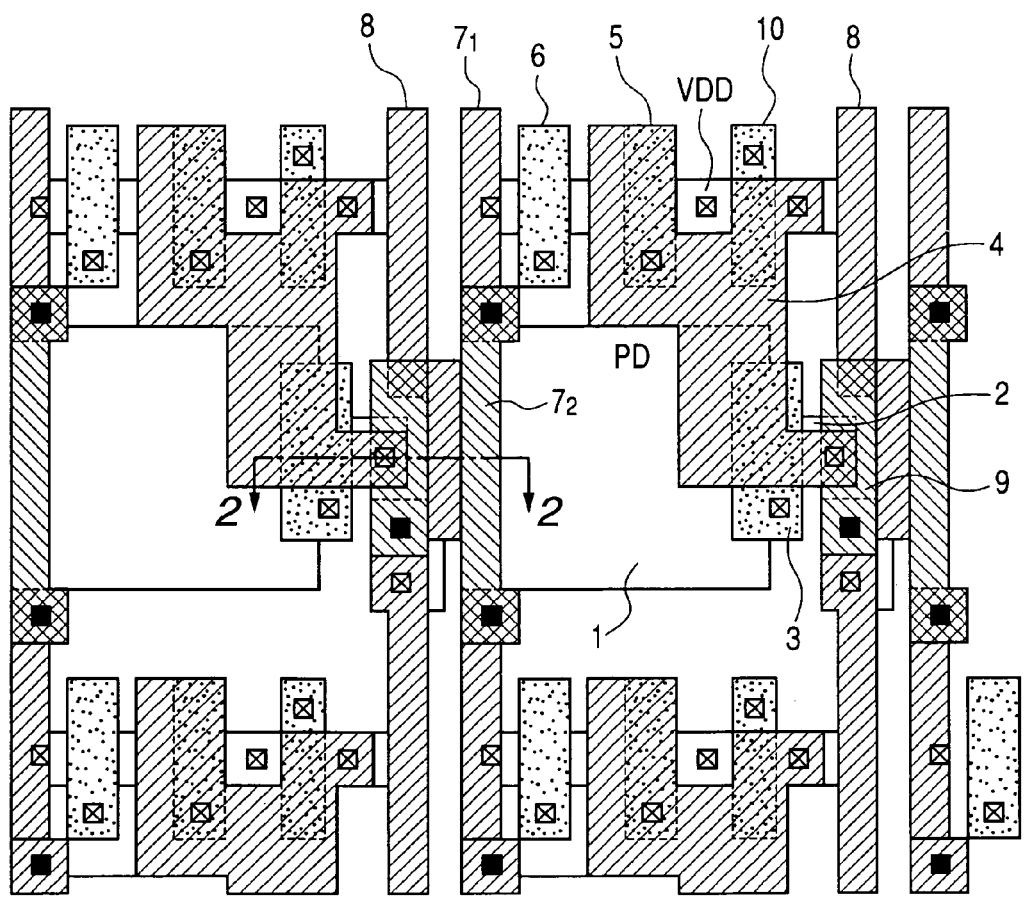
FIG. 8 is a plan view showing a layout of a solid-state image pickup apparatus constituting a third embodiment of the present invention.

FIG. 8 is a plan view showing a layout of a solid-state image pickup apparatus of a third embodiment of the present invention. Components same as those in FIG. 1 are represented as same symbols and will not be explained further. In the present embodiment, at least a part of the FD wiring 4 is formed wider than other wirings such as the signal output line 8 to increase the area of the FD wiring, thereby increasing the capacitance Cfd of the FD portion excluding the parasite capacitance Cp and reducing the value Cp/Cfd, whereby the color mixing is decreased. The width of the FD wiring is so selected that the ratio of Cp to Cfd becomes 1.4% or less.

The solid-state image pickup apparatus of the foregoing embodiments is of a structure which is called a CMOS solid-state image pickup apparatus. In such solid-state image pickup apparatus, signals of plural pixels arranged in a row direction (for example lateral direction in FIG. 1) are simultaneously controlled for readout from the photoelectric conversion area to the signal output line through the FD area and the amplifying transistor, so that a mixed color tends to be generated between the adjacent pixels and the present invention is applied advantageously.

Figure 9:
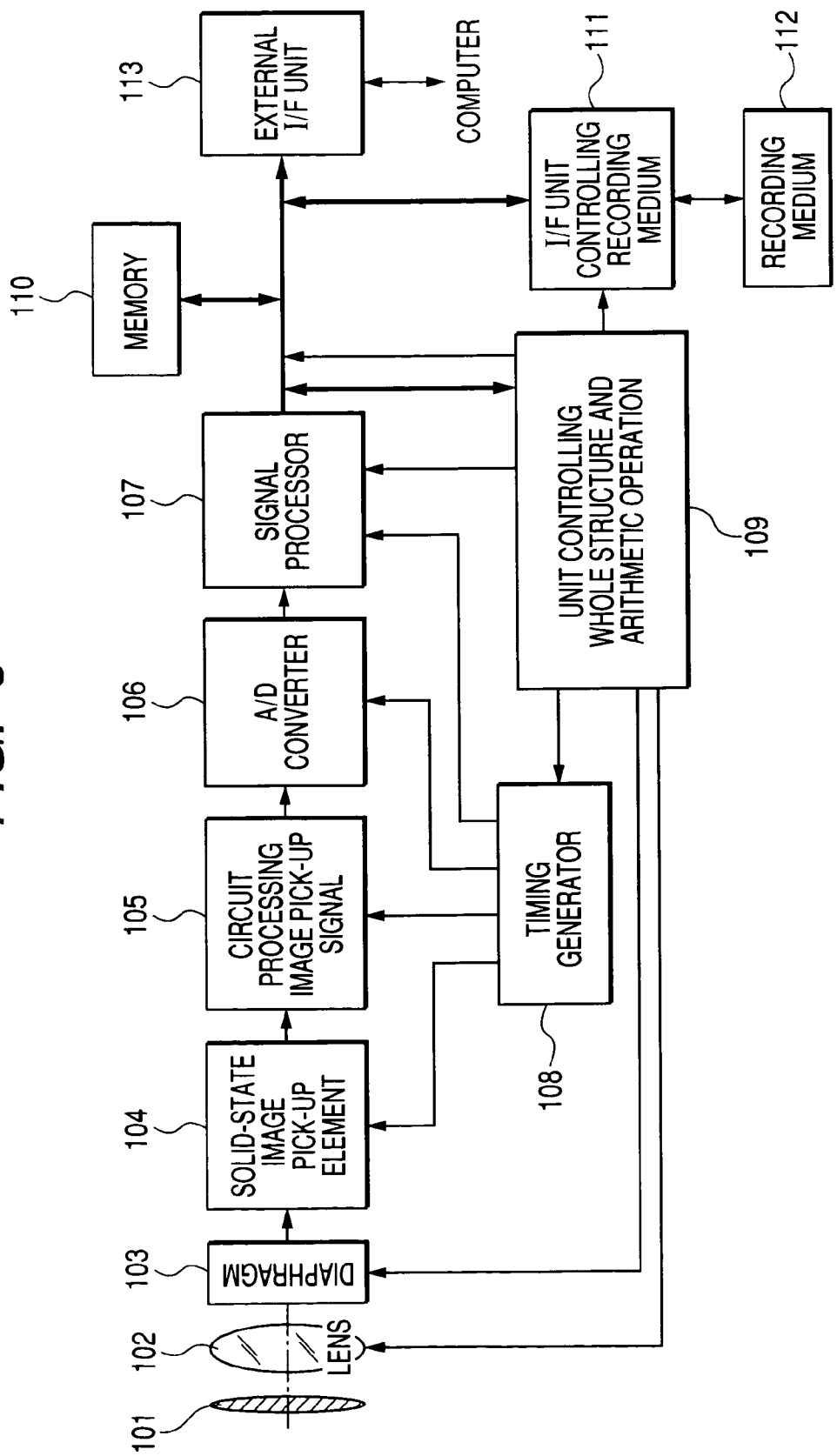
FIG. 9 is a block diagram showing a "still camera" constituting an example of the solid-state image pickup apparatus of the present invention.
Figure 10:
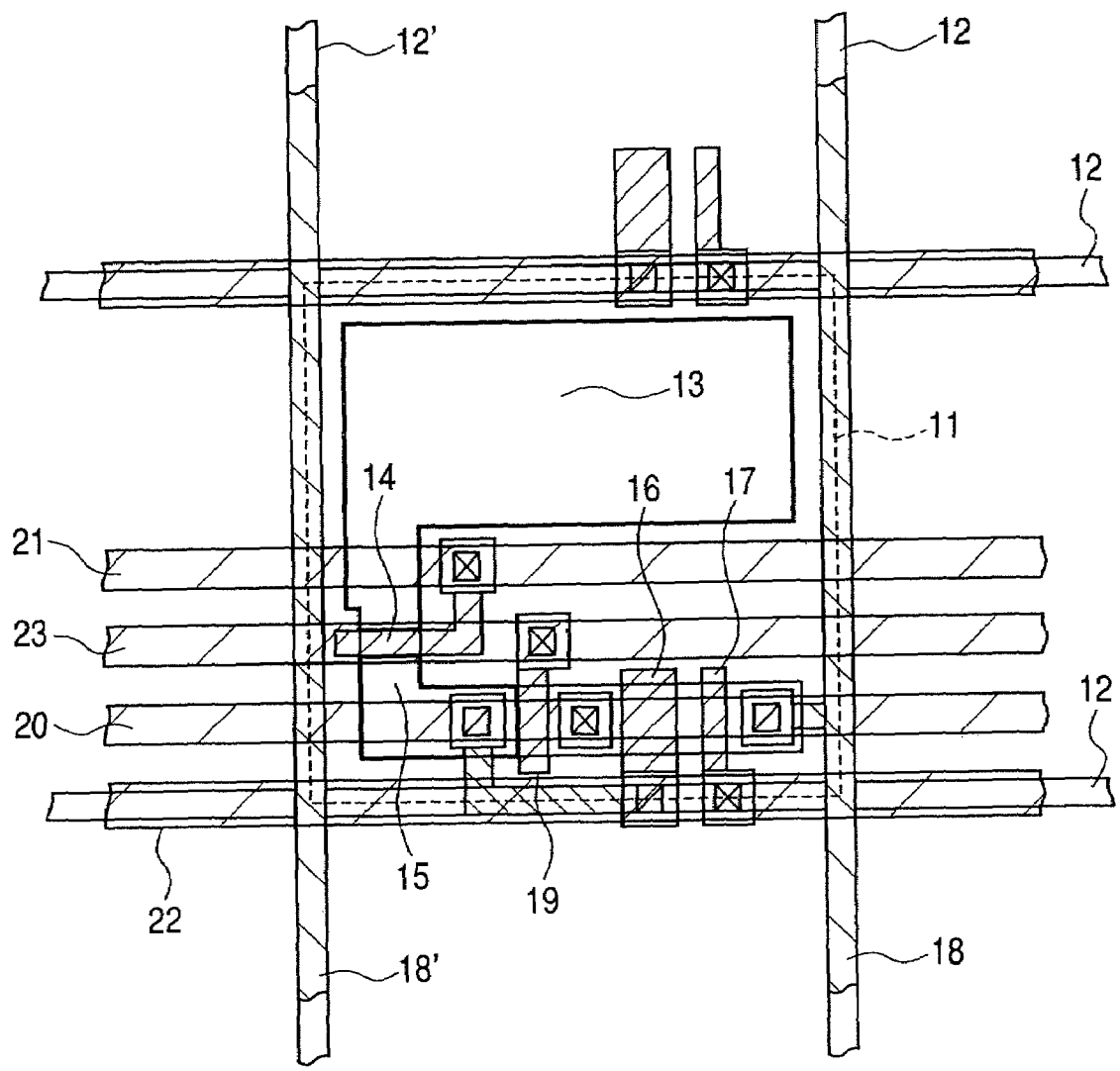
FIG. 10 is a plan view showing a layout of a prior solid-state image pickup apparatus.
Figure 11:
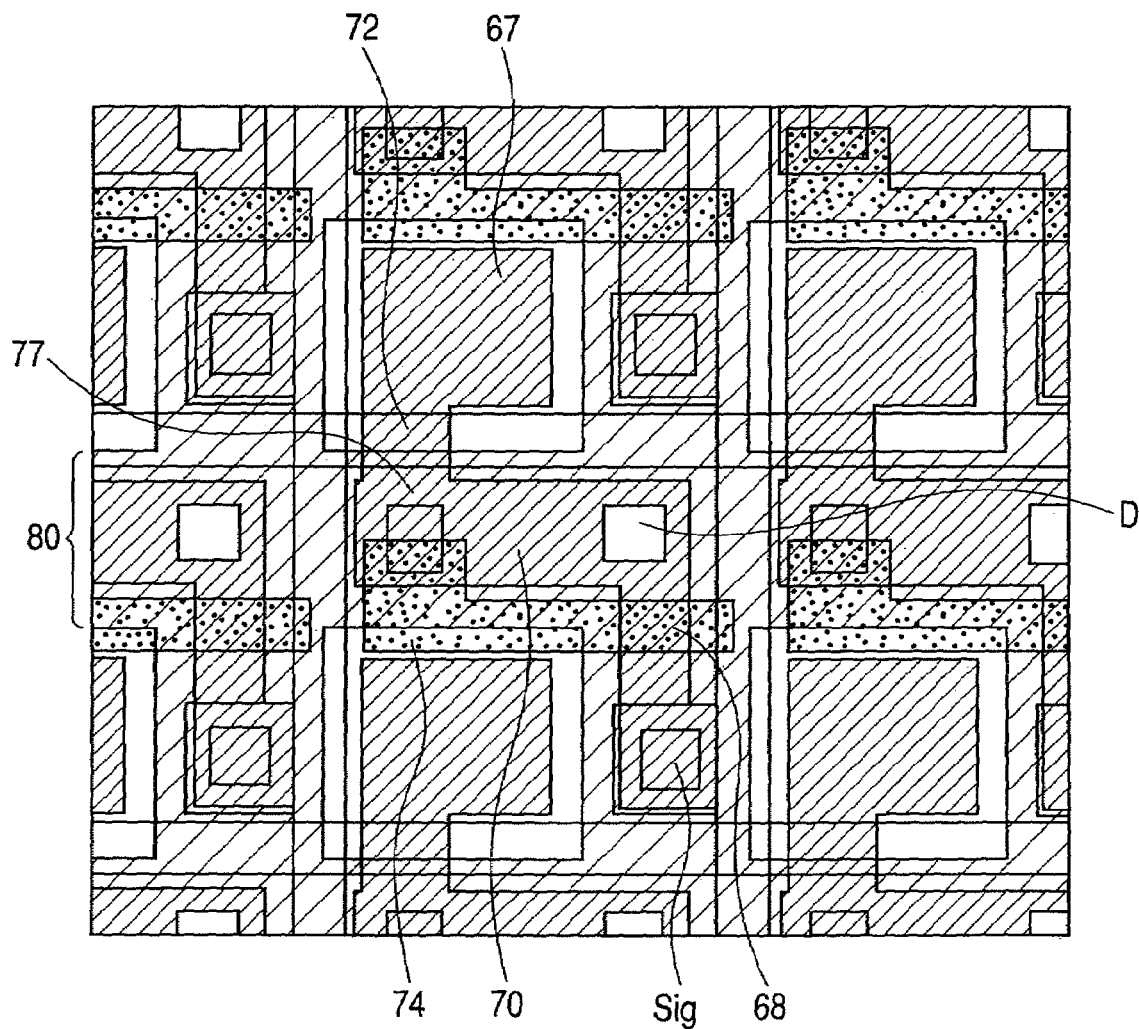
FIG. 11 is a plan view showing a layout of another prior solid-state image pickup apparatus.

FIG. 9 is a block diagram showing a "still camera" constituting an example of the solid-state image pickup apparatus of the invention.

Referring to FIG. 9, there are shown a barrier 101 serving for a lens protection and as a main switch; a lens 102 for focusing an optical image of an object onto a solid-state image pickup element 104; a diaphragm 103 for varying the light amount transmitted through the lens 102; a solid-state image pickup element 104 for fetching the image of the object, focused by the lens 102, as an image signal; an A/D converter 106 for an analog-digital conversion of the image signal outputted from the solid-state image pickup element 104; a signal processor 107 for executing various corrections and a data compression on the image data outputted from the A/D converter 106; a timing generator 108 for outputting timing signals to the solid-state image pickup element 104, the image signal processor 105, the A/D converter 106 and the signal processor 107; a whole structure and operation controller 109 for controlling various arithmetic operations and the entire still video camera; a memory 110 for temporarily storing the image data; an interface 111 for recording on and readout from a recording medium; a detachable recording medium 112 such as a semiconductor memory for recording and readout of the image data; and an interface 113 for communication for example with an external computer.

In the following there will be explained an operation of the still video camera of the aforementioned configuration in an image pickup operation.

When the barrier 101 is opened, a main power supply is turned on, then a power supply for the control system is turned on and a power supply for image pickup circuits such as the A/D converter 106 is turned on.

Then, for controlling the exposure amount, the controller 109 fully opens the diaphragm 103, and a signal outputted from the solid-state image pickup element 104 is converted in the A/D converter 106 and entered into the signal processor 107. Based on such data, the controller 109 calculates the exposure.

Brightness is judged based on such light metering, and the controller 109 controls the diaphragm according to the result thereof.

Then, based on a signal outputted from the solid-state image pickup element 104, a high frequency component is extracted and the controller 109 executes a calculation of a distance to the object. Thereafter the lens is driven and is judged whether it is in a focused position, and, if not, the lens is driven again and a distance measurement is executed.

After a focused state is confirmed, a main exposure is started. After the exposure, an image signal outputted from the solid-state image pickup element 104 is A-D converted by the A/D converter 106, then passed through the signal processor 107 and stored in the memory. Thereafter, the data accumulated in the memory 110 are passed through the recording medium controlling I/F 111 and stored in the detachable recording medium 112 such as a semiconductor memory, under the control of the controller 109. The data may also be supplied through the external I/F 113 to a computer or the like for image processing.

This application claims priority from Japanese Patent Application No. 2004-036858 filed Feb. 13, 2004, which is hereby incorporated by reference herein.

What is claimed is:

1. A solid-state image pickup apparatus, comprising:
   plural pixels each including:
      a photoelectric conversion area,
      a floating diffusion area for holding a charge outputted from the photoelectric conversion area,
      an amplifier for amplifying the charge in the floating diffusion area, and
      a wiring,
      wherein at least an end of the wiring is connected with the floating diffusion area; and
   a signal output line for outputting signals from the amplifiers,
   wherein $C_p/C_{fd}$ is 1.4% or less, in which $C_{fd}$ represents a capacitance of a floating diffusion portion that includes a floating diffusion area of a pixel and a wiring of the pixel, and in which $C_p$ represents a capacitance between the floating diffusion portion of the pixel and a signal output line of an adjacent pixel.

2. The solid-state image pickup apparatus according to claim 1, wherein the apparatus is incorporated in an image pickup system that includes:
   an optical system for focusing light on the solid-state image pickup apparatus, and
   a signal processing circuit for processing an output signal from the solid-state image pickup apparatus.

* * * * *